(12) United States Patent
Chang et al.

(10) Patent No.: US 10,981,779 B2
(45) Date of Patent: Apr. 20, 2021

(54) MEMS DEVICES AND METHODS OF FORMING THE SAME

(71) Applicant: Taiwan Semiconductor Manufacturing Company, Ltd., Hsinchu (TW)

(72) Inventors: Kai-Fung Chang, Taipei (TW); Len-Yi Leu, Hsinchu (TW); Lien-Yao Tsai, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 49 days.

(21) Appl. No.: 15/910,647

(22) Filed: Mar. 2, 2018

(65) Prior Publication Data
US 2018/0194618 A1 Jul. 12, 2018

Related U.S. Application Data

(62) Division of application No. 15/003,332, filed on Jan. 21, 2016, now Pat. No. 9,926,190.

(51) Int. Cl.
*B61C 1/00* (2006.01)
*B81C 1/00* (2006.01)
(Continued)

(52) U.S. Cl.
CPC ........ *B81C 1/00158* (2013.01); *B81B 3/0021* (2013.01); *B81B 7/02* (2013.01); *B81B 2201/0235* (2013.01); *B81B 2201/0264* (2013.01); *B81B 2203/0127* (2013.01); *B81B 2207/09* (2013.01); *B81C 2203/0109* (2013.01);
(Continued)

(58) Field of Classification Search
CPC ........ B81C 1/00158; B81C 2203/0109; B81C 2203/0172; B81C 2203/0127; B81B 7/02; B81B 3/0021; B81B 2201/0235; B81B 2201/0264; B81B 2207/09; H01L 21/76898; H01L 23/481;
(Continued)

(56) References Cited

U.S. PATENT DOCUMENTS

| 5,310,450 A | 5/1994 | Offenberg et al. |
| 8,802,473 B1 | 8/2014 | Chu et al. |

(Continued)

FOREIGN PATENT DOCUMENTS

| CN | 103674112 A | 3/2014 |
| CN | 103792036 A | 5/2014 |

(Continued)

*Primary Examiner* — Robert T Huber
*Assistant Examiner* — Gardner W. S. Swan
(74) *Attorney, Agent, or Firm* — Slater Matsil, LLP

(57) ABSTRACT

A MEMS device and methods of forming are provided. A dielectric layer of a first substrate is patterned to expose conductive features and a bottom layer through the dielectric layer. A first surface of a second substrate is bonded to the dielectric layer and the second substrate is patterned to form a membrane and a movable element. A cap wafer is bonded to the second substrate, where bonding the cap wafer to the second substrate forms a first sealed cavity comprising the movable element and a second sealed cavity that is partially bounded by the membrane. Portions of the cap wafer are removed to expose the second sealed cavity to ambient pressure.

20 Claims, 26 Drawing Sheets

(51) Int. Cl.
   B81B 3/00 (2006.01)
   B81B 7/02 (2006.01)
   *H01L 23/48* (2006.01)
   *G01L 9/00* (2006.01)
   *H01L 21/768* (2006.01)

(52) U.S. Cl.
   CPC .... *B81C 2203/0172* (2013.01); *G01L 9/0042* (2013.01); *G01L 9/0073* (2013.01); *H01L 21/76898* (2013.01); *H01L 23/481* (2013.01); *H01L 2224/80805* (2013.01); *H01L 2224/81805* (2013.01)

(58) Field of Classification Search
   CPC . H01L 2224/81805; H01L 2224/80805; G01L 9/0073; G01L 9/0042
   See application file for complete search history.

(56) References Cited

U.S. PATENT DOCUMENTS

| | | |
|---|---|---|
| 9,040,334 B2 | 5/2015 | Chu et al. |
| 9,187,317 B2 | 11/2015 | Cheng et al. |
| 2005/0172717 A1 | 8/2005 | Wu et al. |
| 2008/0315333 A1 | 12/2008 | Combi et al. |
| 2011/0126632 A1 | 6/2011 | McNeil et al. |
| 2011/0159627 A1 | 6/2011 | Mantravadi et al. |
| 2012/0043627 A1* | 2/2012 | Lin .............. B81B 7/02 257/415 |
| 2012/0260747 A1 | 10/2012 | Chen et al. |
| 2013/0001710 A1 | 1/2013 | Daneman et al. |
| 2013/0283912 A1 | 10/2013 | Lin |
| 2013/0340525 A1 | 12/2013 | Liu |
| 2014/0264653 A1 | 9/2014 | Cheng et al. |
| 2014/0319631 A1* | 10/2014 | Chu .............. B81B 7/02 257/417 |
| 2015/0059485 A1* | 3/2015 | Haag .............. B81B 7/007 73/725 |
| 2016/0137491 A1 | 5/2016 | Su et al. |
| 2016/0341616 A1 | 11/2016 | Classen |
| 2018/0044174 A1* | 2/2018 | Zheng .............. B81B 3/0021 |

FOREIGN PATENT DOCUMENTS

| | | |
|---|---|---|
| CN | 104303262 | 1/2015 |
| JP | 2007064919 A | 3/2007 |
| JP | 2009270961 A | 11/2009 |
| JP | 2015011002 A | 1/2015 |
| TW | 201534883 A | 9/2015 |

\* cited by examiner

MEMS DEVICES AND METHODS OF FORMING THE SAME

This application is a divisional of U.S. patent application Ser. No. 15/003,332, filed Jan. 21, 2016, entitled "MEMS Devices and Methods of Forming the same," which application is hereby incorporated herein by reference.

BACKGROUND

Micro-electromechanical systems ("MEMS") are becoming increasingly popular, particularly as such devices are miniaturized and are integrated into integrated circuit manufacturing processes. MEMS devices introduce their own unique requirements into the integration process, however. Electrically interconnecting MEMS devices is an area of unique challenges. In particular, integrating different MEMS devices into the same integrated circuit manufacturing process has posed challenges.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION

Figure 1:
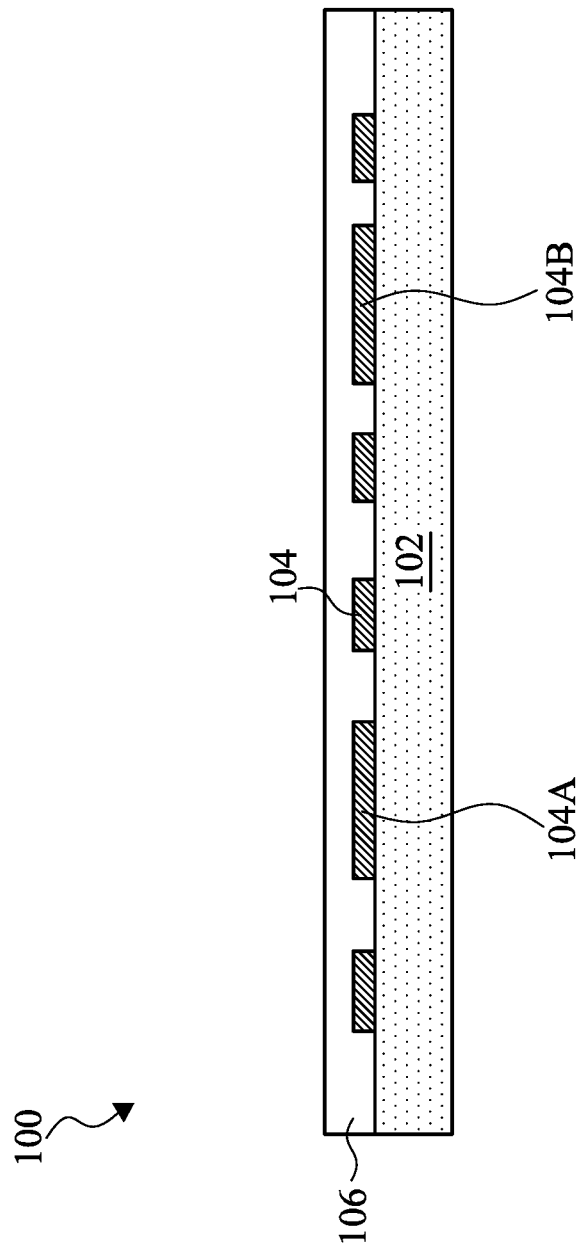
FIGS. 1 through 26 are cross-sectional views of intermediate stages of manufacture of a MEMS device in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 25:
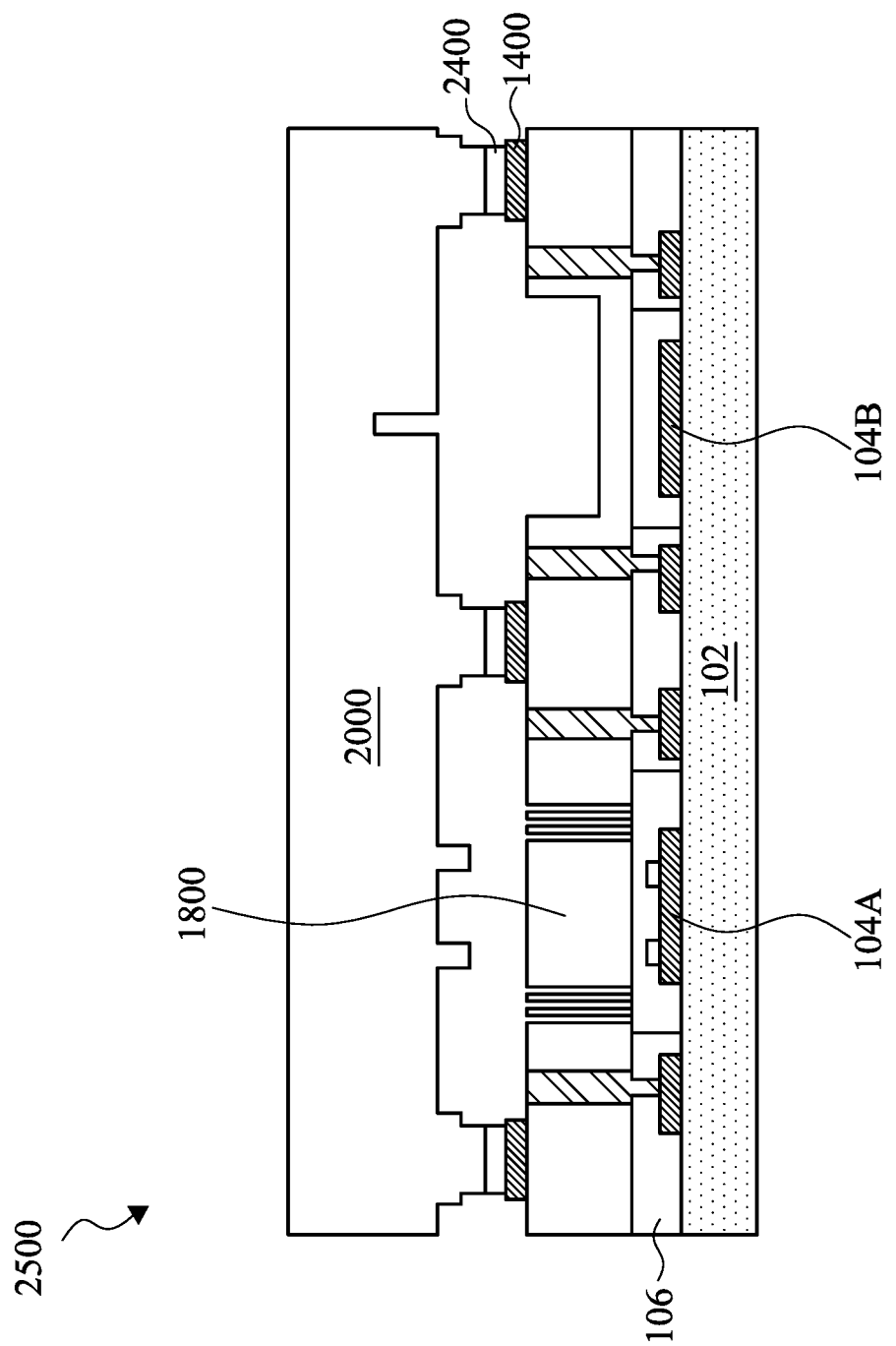
Figure 26:
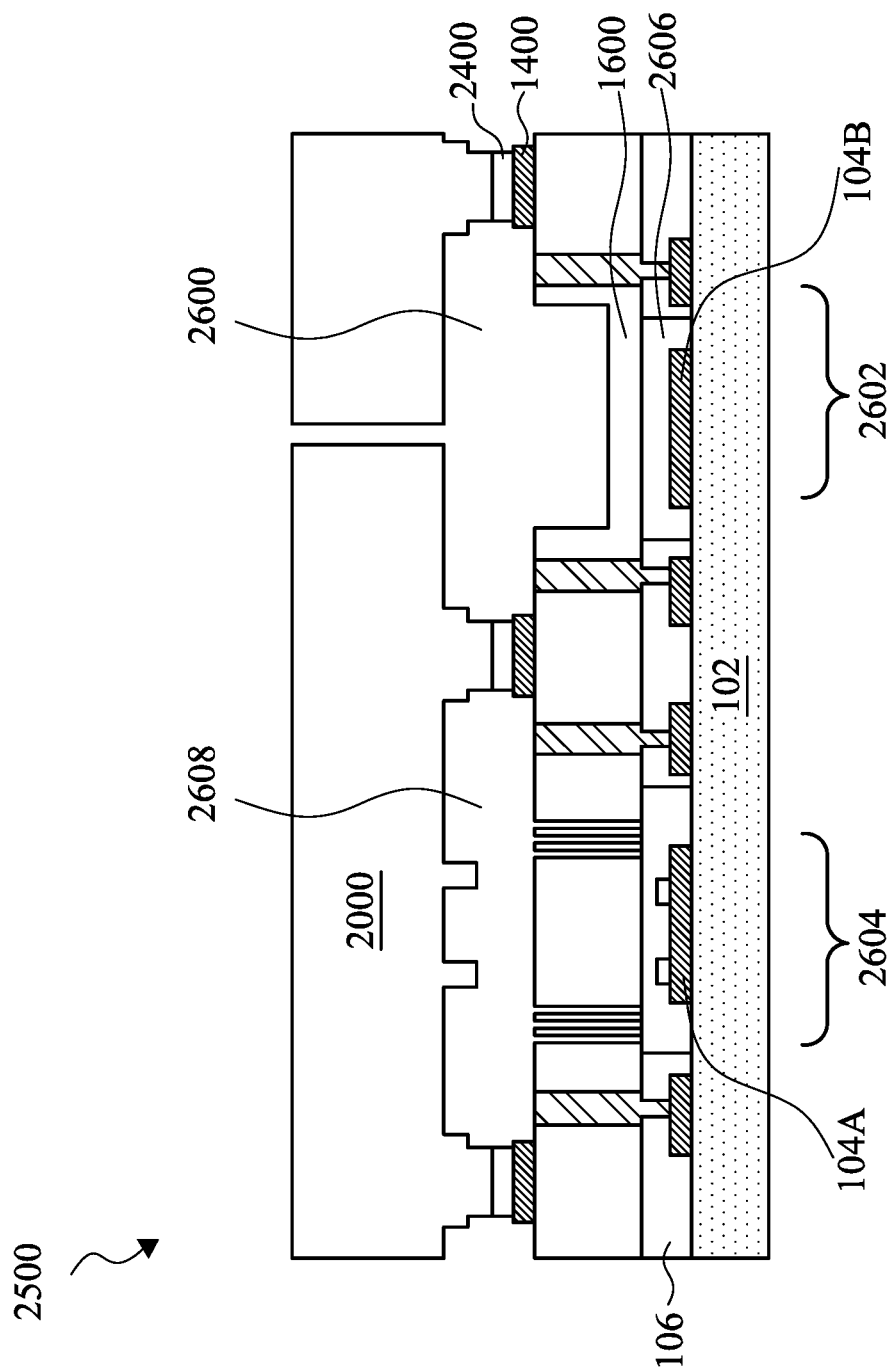

FIGS. 1 through 26 illustrate cross-sectional views of intermediate stages of manufacture of a MEMS device 2500 having a pressure sensor and an accelerometer (see FIG. 26). The pressure sensor and accelerometer are manufactured using the same integrated circuit (IC) chip and process. Therefore, various embodiments illustrated by FIGS. 1 through 26 allow for the smooth integration of manufacturing a MEMS pressure sensor device and accelerometer on a single chip.

As shown in FIG. 1, structure 100 includes a substrate 102. Substrate 102 may be formed of silicon, or other materials such as silicon germanium, silicon carbide, a combination thereof, or the like. Substrate 102 may be formed of low resistivity silicon. In some embodiments, substrate 102 may be a silicon-on-insulator (SOI) substrate. An SOI substrate may comprise a layer of semiconductor material (e.g., silicon, germanium, and the like) formed over an insulator layer (e.g., buried oxide), which is formed in a silicon substrate. In addition, other substrates that may be used include multi-layered substrates, gradient substrates, hybrid orientation substrates, and the like.

A layer of metallization 104 is formed over substrate 102. Metallization layer 104 may comprise electrical components of the MEMS devices. For example, metallization layer 104 may include one or more sensors for one or more MEMS devices, such as a sensor 104A for an accelerometer and a sensor 104B for a pressure sensor. Metallization layer 104 may also include electrical connections between components of the MEMS devices and to external devices and components.

Metallization layer 104 may be formed using any suitable methods. For example, in some embodiments, the formation of metallization layer 104 includes forming a dielectric layer 106 is formed on substrate 102. In some embodiments, dielectric layer 106 is formed of a polymer, which may be a photo-sensitive material such as polybenzoxazole (PBO), polyimide, benzocyclobutene (BCB), an alloy or combination thereof, or the like, that may be patterned using lithography. In other embodiments, dielectric layer 106 is formed of a nitride such as silicon nitride, an oxide such as silicon oxide, PhosphoSilicate Glass (PSG), BoroSilicate Glass (BSG), Boron-doped PhosphoSilicate Glass (BPSG), an alloy or combination thereof, or the like. Dielectric layer 106 may be formed by spin coating, lamination, chemical vapor deposition (CVD), the like, or a combination thereof. Dielectric layer 106 is then patterned to form openings in which metallization layer 104 will be formed. In embodiments in which dielectric layer 106 is formed of a photo-sensitive material, the patterning may be performed by exposing dielectric layer 106 in accordance with a desired pattern and developed to remove the unwanted material, thereby exposing the desired locations of metallization layer 104. Other methods, such as using a patterned mask and etching, may also be used to pattern dielectric layer 106.

A seed layer (not shown) is formed over dielectric layer 106 and in the openings formed in dielectric layer 106. In some embodiments, the seed layer is a metal layer, which may be a single layer or a composite layer comprising a plurality of sub-layers formed of different materials. In some embodiments, the seed layer is a metal layer, which may be a single layer or a composite layer comprising a plurality of sub-layers formed of different materials. The seed layer may be made of copper, titanium, nickel, gold, an alloy or combination thereof, or the like. In some embodiments, the seed layer comprises a titanium layer and a copper layer over the titanium layer. The seed layer may be formed using, for example, physical vapor deposition (PVD), chemical vapor deposition (CVD), atomic layer deposition (ALD), an alloy or combination thereof, or the like.

A conductive material is then formed on the seed layer and in the openings formed in dielectric layer 106. The conductive material may be formed by plating, such as electroplating or electroless plating, or the like. The conductive material may comprise a metal, like copper, titanium, tungsten, aluminum, an alloy or combination thereof, or the like. Next, excess conductive material overlying the openings in dielectric layer 106 and portions of the seed layer not disposed in an opening of dielectric layer 106 are removed, for example using grinding or chemical mechanical polishing (CMP) or an acceptable etching process, such as by wet or dry etching. The remaining portions of the seed layer and conductive material form the electrical connections of metallization layer 104.

Figure 2:
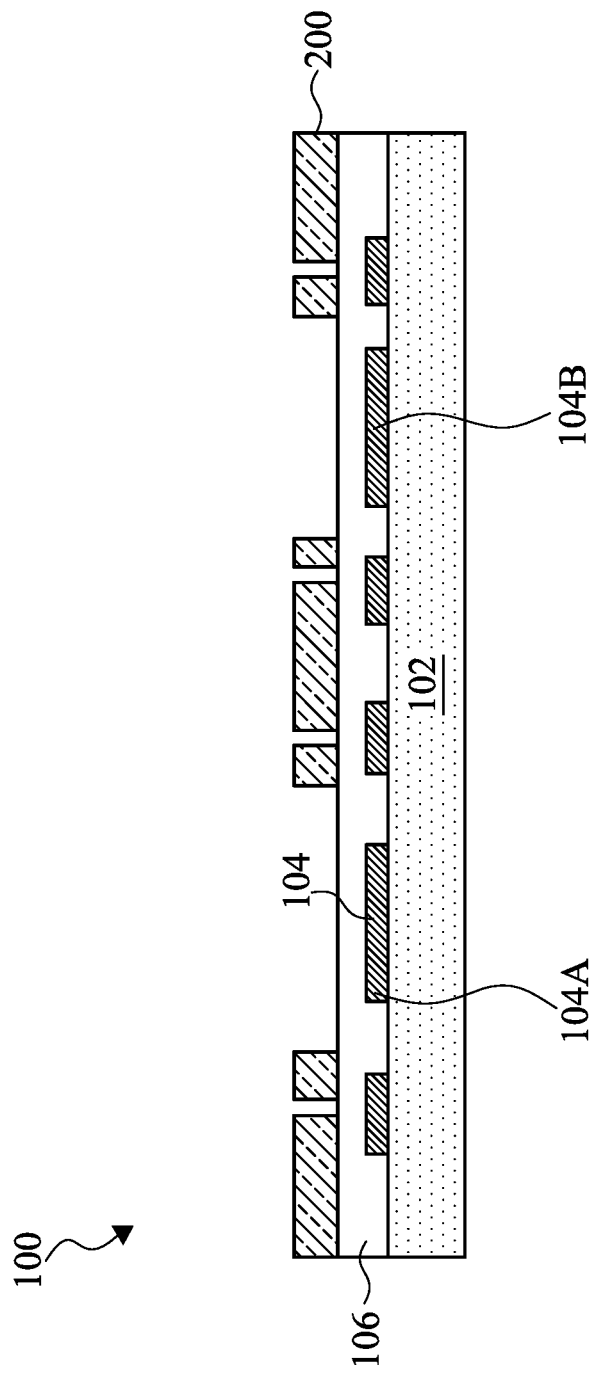

Next, referring to FIG. 2, a photoresist layer 200 is deposited over dielectric layer 106 and patterned. The patterning of photoresist layer 200 exposes the areas of dielectric layer 106 above the metallization layer 104 where the MEMS cavities will be formed. As will be explained in greater detail below, a MEMS accelerometer and a MEMS pressure sensor each comprise a cavity in which a sensor is positioned. Photoresist layer 200 is patterned to expose dielectric layer 106 over and surrounding sensors 104A and 104B where the cavities will be created. Photoresist layer 200 is also patterned to expose the areas of dielectric layer 106 where through vias will be located. As will be discussed in greater detail below, a substrate 800 will be bonded to dielectric layer 106 on an opposite side of dielectric layer 106 from substrate 102 (see FIG. 8). The through vias will provide an electrical connection between metallization layer 104 and contacts on the other side of the substrate 800.

Figure 3:
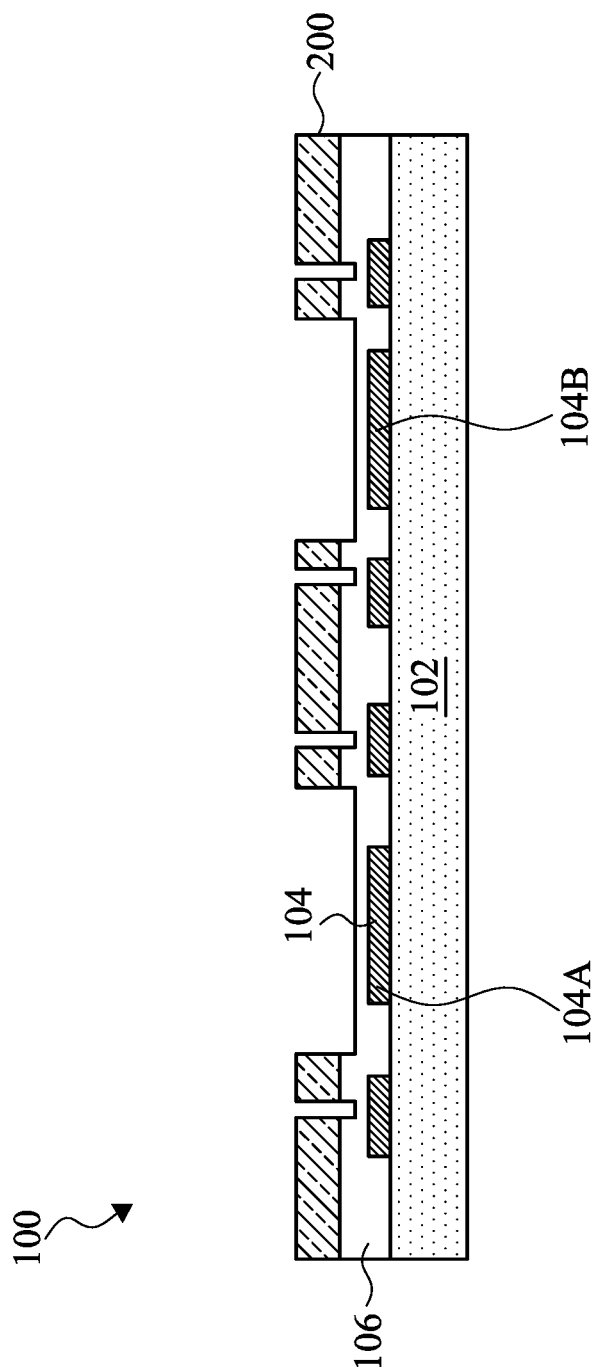
Figure 4:
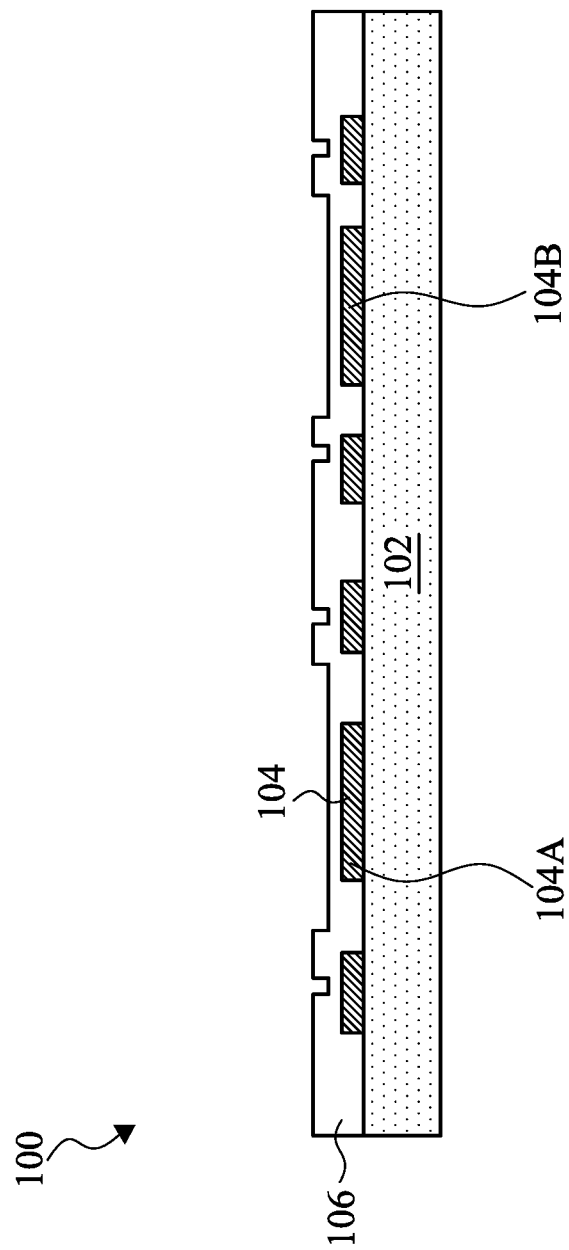

After photoresist layer 200 is patterned, dielectric layer 106 is etched. Any acceptable etching process may be used, such as wet or dry etching. The etched structure is depicted in FIG. 3. As shown in FIG. 3, the etching is a shallow etching and the etching does not penetrate through dielectric layer 106 and does not expose metallization layer 104. Photoresist layer 200 is then removed. Photoresist layer 200 may be removed through a process such as dissolving in chemical solution, plasma ashing or other means, whereby the temperature of photoresist layer 200 is increased until photoresist layer 200 decomposes and may be removed. After photoresist layer 200 is removed, the resulting structure is depicted in FIG. 4.

Figure 5:
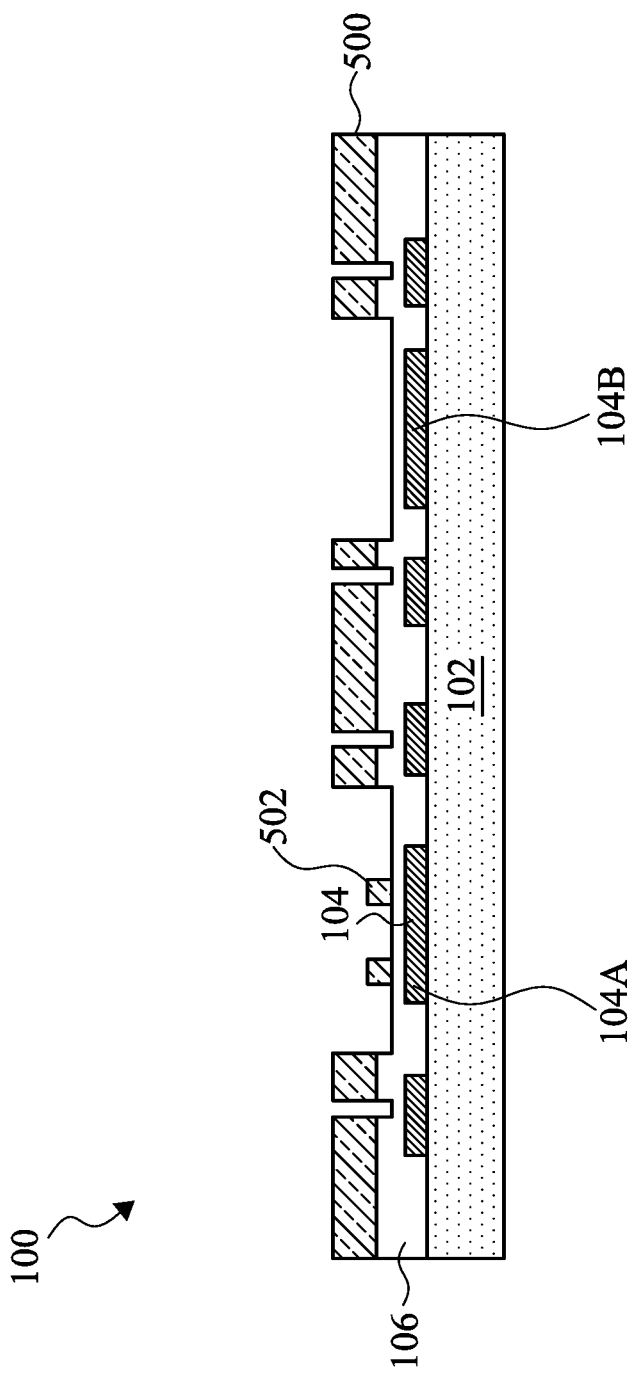

Next, referring to FIG. 5, a photoresist layer 500 is deposited and patterned. As with photoresist layer 200, the patterning of photoresist layer 500 exposes the areas of dielectric layer 106 above metallization layer 104 where the MEMS cavities will be formed. In some embodiments, in may be desirable to retain sections of dielectric layer 106 over metallization layer 104 inside of the planned MEMS cavity. These sections may serve a variety of purposes. For example, in some embodiments these sections may form mechanical bumps that limit the motion of moving elements in a MEMS device. These sections may also be used as anti-stiction bumps. As such, photoresist layer 500 is patterned over the planned MEMS cavity in a manner that retains sections 502 of photoresist layer 500. Section 502 will prevent the underlying areas of dielectric layer 106 from being removed in a subsequent etching step. Photoresist layer 500 is also patterned to expose the areas of dielectric layer 106 where through vias will be located.

Figure 6:
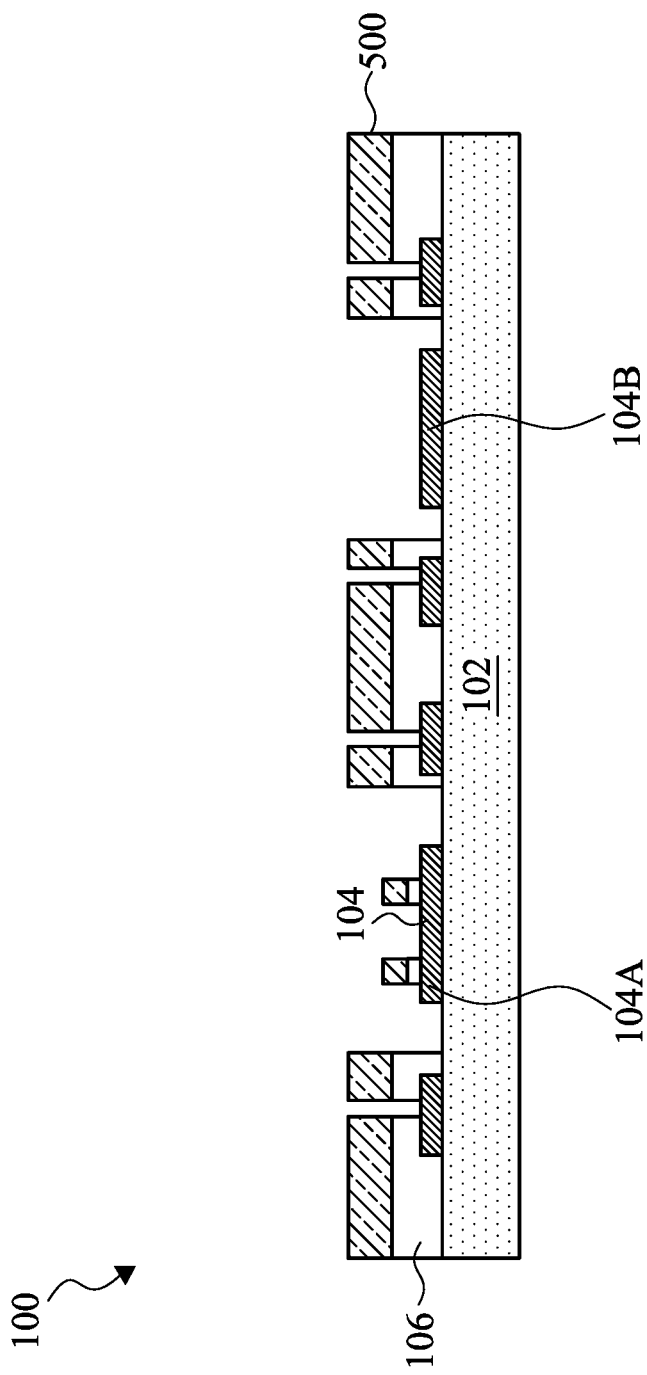
Figure 7:
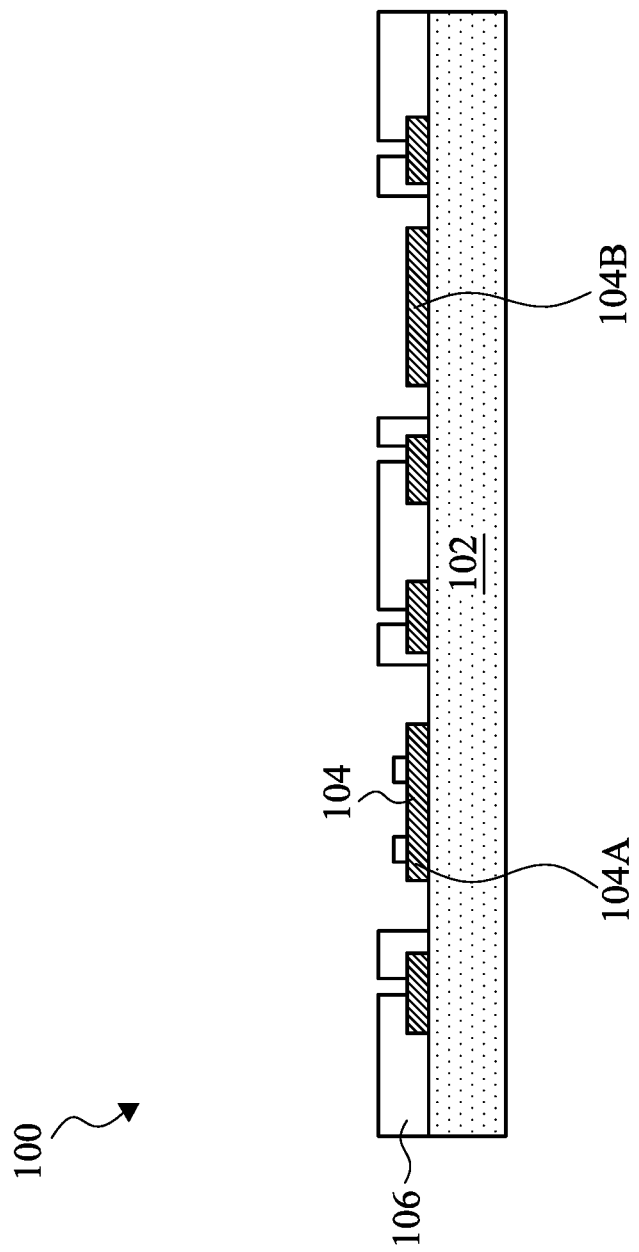

After photoresist layer 500 is patterned, dielectric layer 106 is etched again. Any acceptable etching process may be used, such as wet or dry etching. The etched structure is depicted in FIG. 6. As illustrated in FIG. 6, the etching exposes sections of metallization layer 104, particularly sensors 104A and 104B. The etching also exposes substrate 102 surrounding sensors 104A and 104B and where the through vias will be formed. Photoresist layer 500 is then removed, leaving the structure depicted in FIG. 7. Photoresist layer 500 may be removed through a process such as dissolving in chemical solution, plasma ashing or other means, whereby the temperature of the photoresist layer 500 is increased until photoresist layer 500 decomposes and may be removed.

Figure 8:
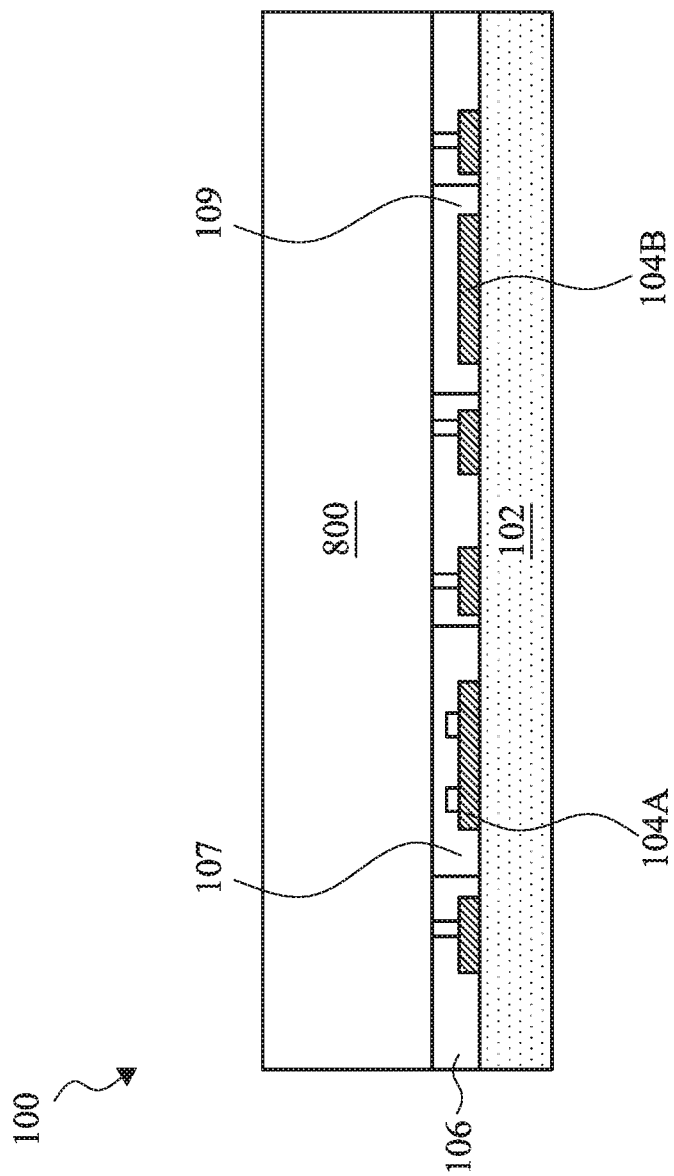

Next, referring to FIG. 8, substrate 800 is bonded to structure 100. Substrate 800 is bonded to a surface of dielectric layer 106 that is opposite to the interface of dielectric layer 105 and substrate 102. Substrate 800 may be formed of silicon, or other materials such as silicon germanium, silicon carbide, an alloy or combination thereof, or the like. Substrate 800 may be formed of low resistivity silicon. In some embodiments, substrate 800 may be a silicon-on-insulator (SOI) substrate. An SOI substrate may comprise a layer of semiconductor material (e.g., silicon, germanium, and the like) formed over an insulator layer (e.g., buried oxide), which is formed in a silicon substrate. In addition, other substrates that may be used include multi-layered substrates, gradient substrates, hybrid orientation substrates, and the like.

Substrate 800 may be bonded to structure 100 using any suitable technique such as fusion bonding, anodic bonding, eutectic bonding, and the like. For example, in various embodiments, substrate 800 may be fusion bonded to structure 100 using a thin polysilicon layer (not shown) as a bonding interface. In some embodiments, the bonding interface may be formed by a deposition process. Once formed, substrate 800 is aligned with structure 100 and the two are contacted together to initiate a bonding of the substrate 800 to structure 100. Once the bonding has been initiated by contacting substrate 800 to structure 100, the bonding process may be strengthened by heating substrate 800 and structure 100 to a temperature. In some embodiments, the temperature may be from 100 degrees to 600 degrees. In some embodiments, a bonding force is applied to substrate 800 and structure 100 to strengthen the bonding process. In some embodiments, a force from 1 KN to 50 KN may be applied.

The bonding of substrate 800 to structure 100 creates cavities in which MEMS devices may be formed. For example, after the bonding, accelerometer sensor 104A is disposed in a cavity 107, and pressure sensor 104B is disposed in a cavity 109.

Figure 9:
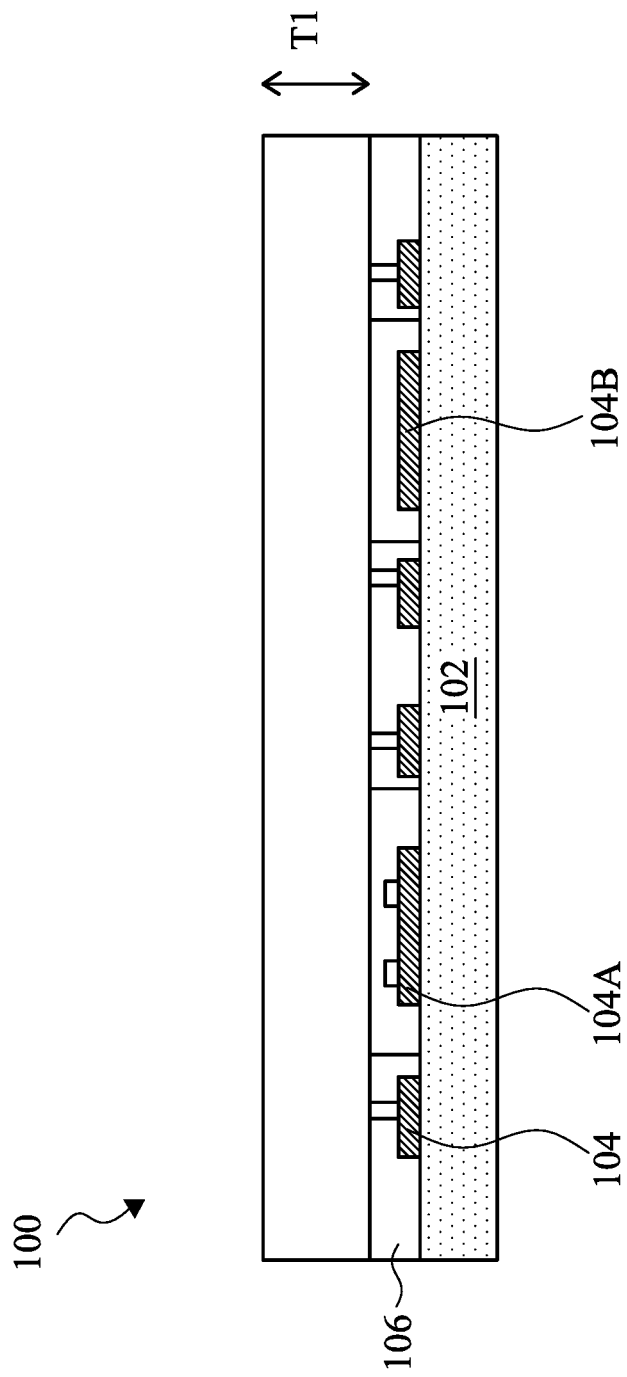

Referring to FIG. 9, substrate 800 may be thinned to a desired thickness T1. The thinning process may include grinding or CMP processes, etch back processes, or other acceptable processes performed on a surface of substrate 800. As a result of this thinning process, substrate 800 may have a thickness T1 from about 10 μm to about 50 μm, such as about 30 μm.

Figure 10:
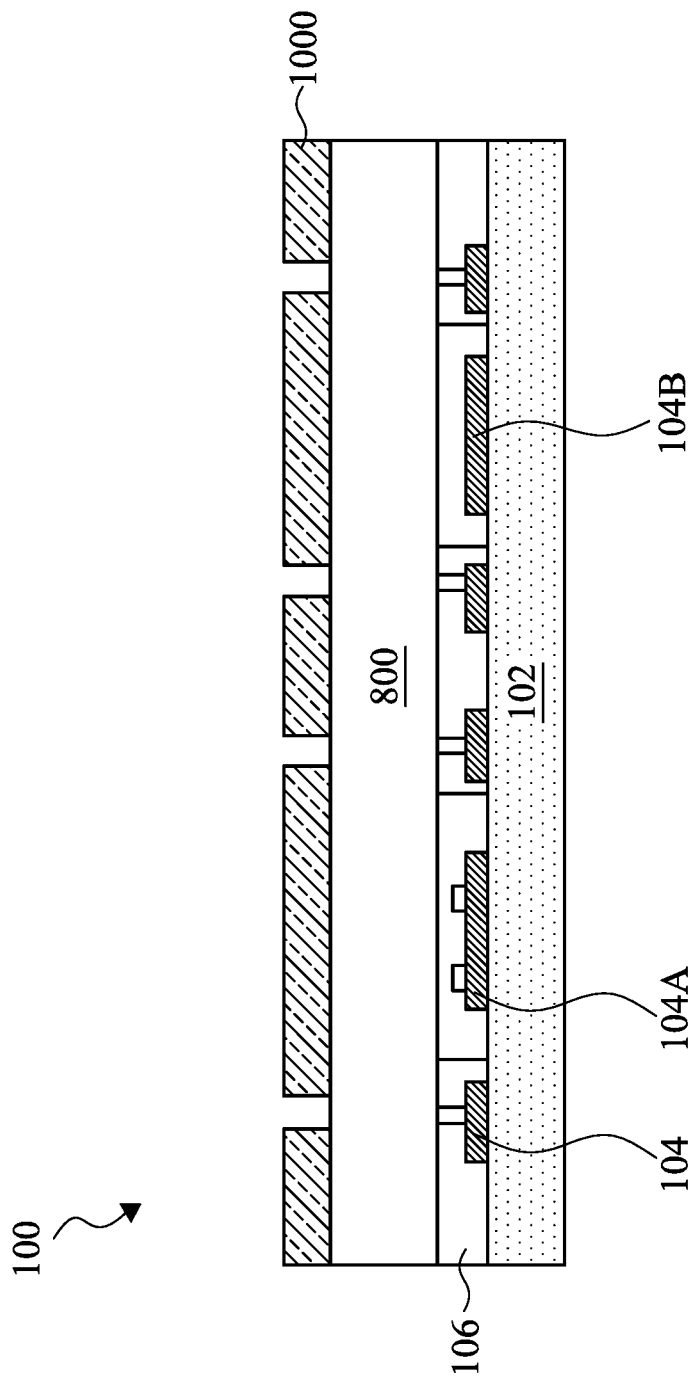

Next, as shown in FIG. 10, photoresist layer 1000 is deposited and patterned. Openings in photoresist layer 1000 expose areas of substrate 800 where through vias will be formed. The through vias provide electrical connections from metallization layer 104 to contacts that will subsequently be formed on a top surface of substrate 800.

Figure 11:
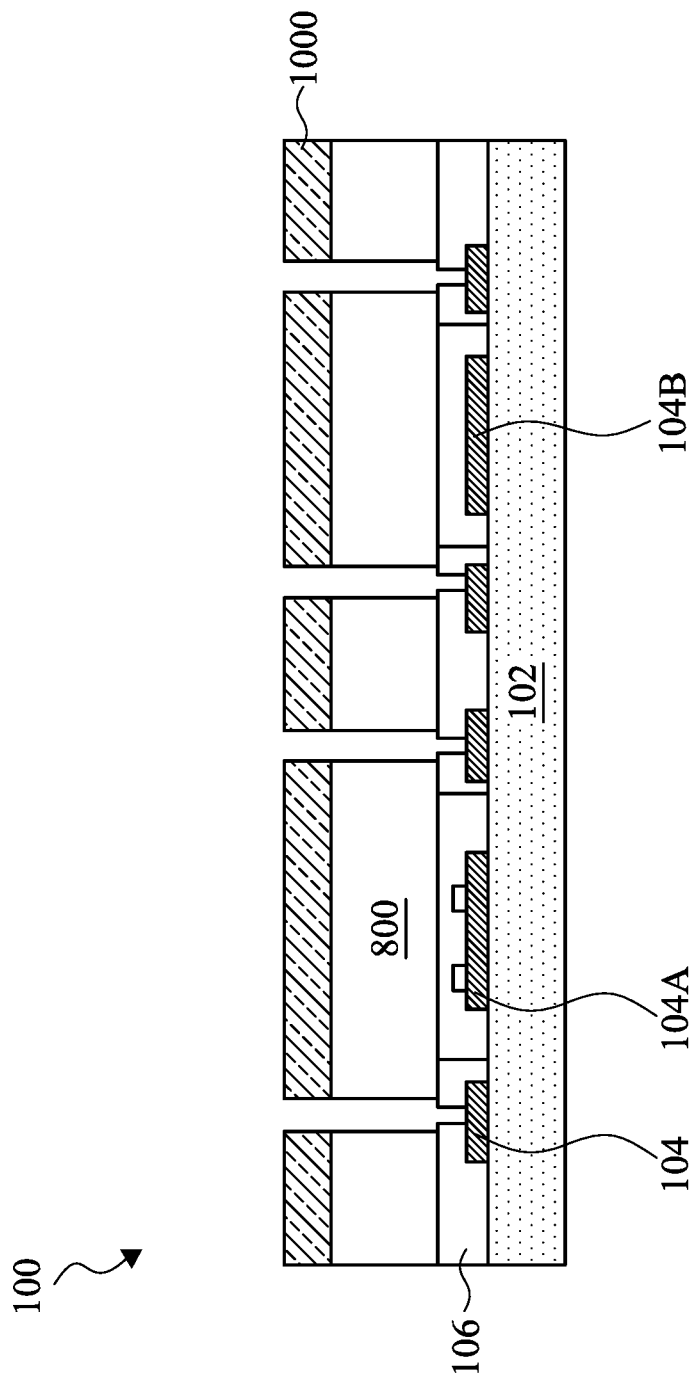

Next, referring to FIG. 11, substrate 800 is etched through the openings in photoresist layer 1000. Any acceptable etching process may be used, such as wet or dry etching. As shown in FIG. 11, the etching creates openings in substrate 800 that penetrate through substrate 800. The openings in substrate 800 are positioned over the through via openings previously created in dielectric layer 106. Photoresist layer 1000 is then removed. Photoresist layer 1000 may be removed through a process such as dissolving in chemical solution, plasma ashing or other means, whereby the temperature of photoresist layer 1000 is increased until photoresist layer 1000 decomposes and may be removed.

Figure 12:
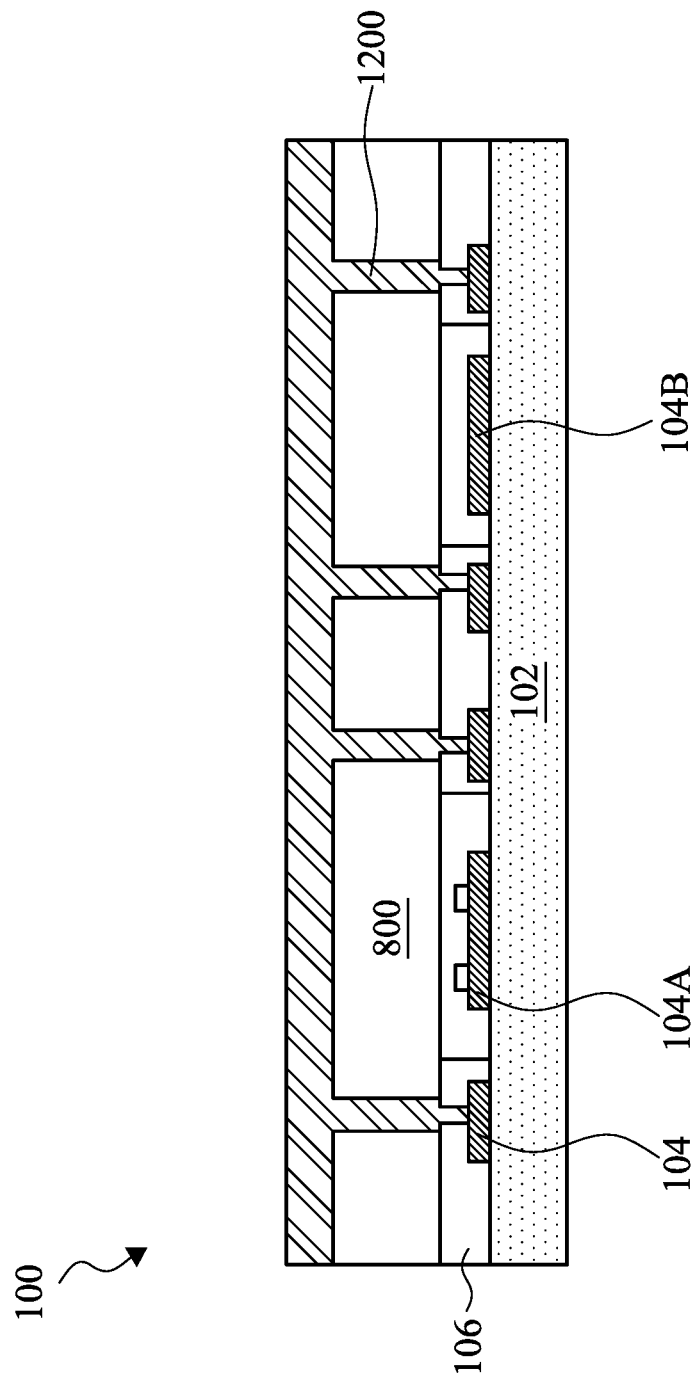

Referring to FIG. 12, through vias 1200 are formed in the openings. Through vias 1200 may be formed, for example, by forming a conductive seed layer (not shown) over the substrate 800. In some embodiments, the seed layer is a metal layer, which may be a single layer or a composite layer comprising a plurality of sub-layers formed of different materials. The seed layer may be made of copper, titanium, nickel, gold, an alloy or combination thereof, or the like. In some embodiments, the seed layer comprises a titanium layer and a copper layer over the titanium layer. The seed layer may be formed using, for example, PVD, CVD, ALD, a combination thereof, or the like.

Next, the openings may be filled with a conductive material using, for example, an electroless plating process or an electrochemical plating process, thereby creating through vias 1200. Through vias 1200 may comprise copper, aluminum, tungsten, nickel, solder, or an alloy or combination thereof. The top-view shapes of through vias 1200 may be rectangles, squares, circles, or the like.

Figure 13:
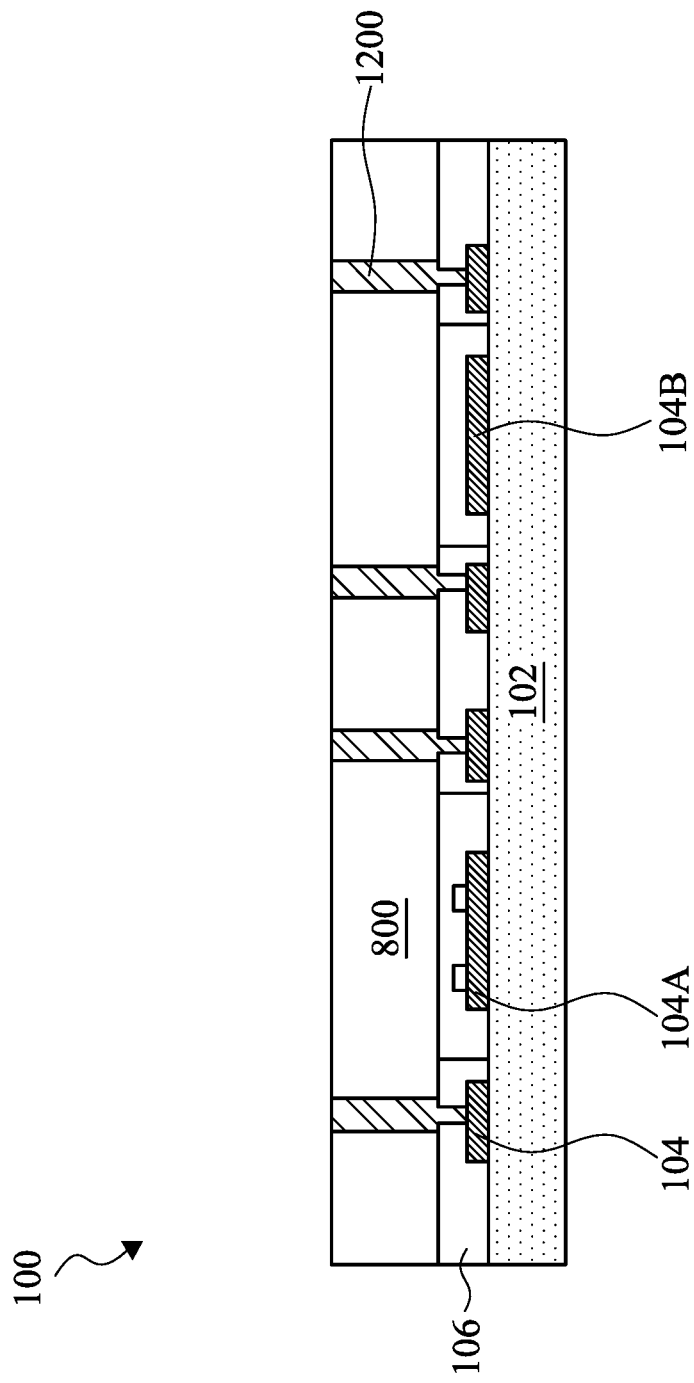

Next, referring to FIG. 13, an etch step or a grinding process, such as a CMP process, may be performed to remove the exposed portions of the seed layer overlying substrate 800 and any excess conductive material overlying through vias 1200. Any suitable etching or grinding process may be used. The resulting structure is depicted in FIG. 13.

In some embodiments, when the seed layer used to form the through vias is formed of a material similar to or the same as through vias 1200, the seed layer may be merged with the through vias 1200 with no distinguishable interface between. In some embodiments, there exist distinguishable interfaces between the seed layer and through vias 1200.

Figure 14:
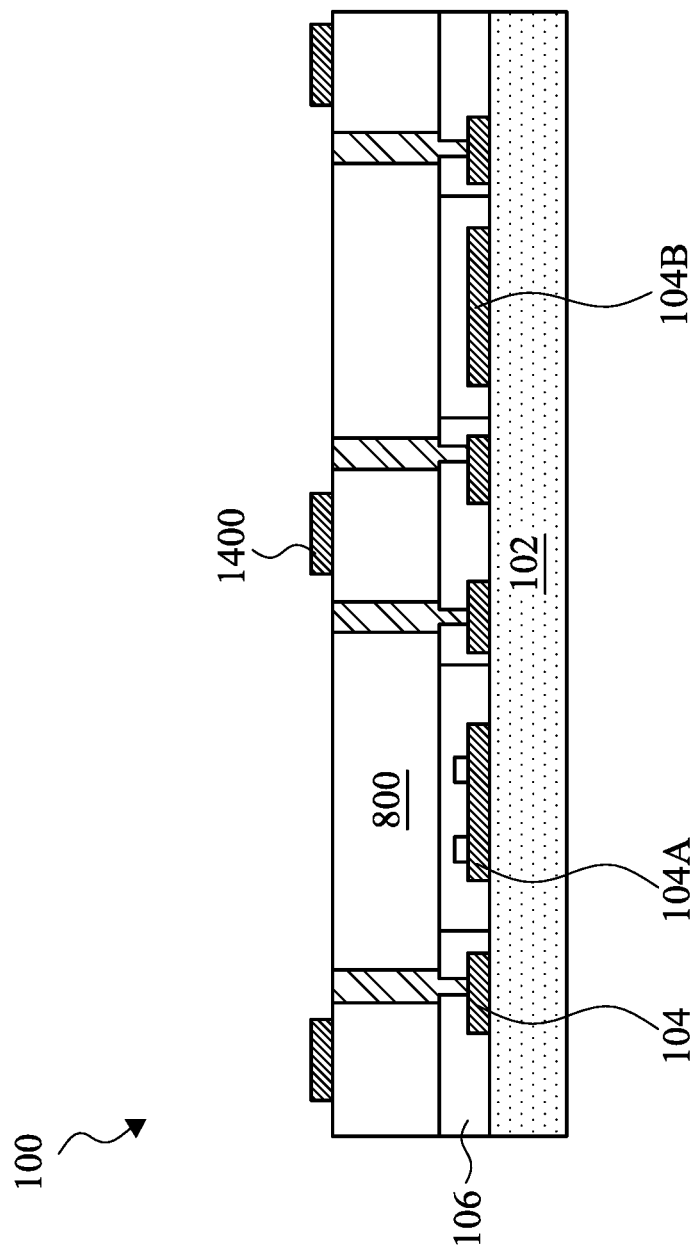

Next, referring to FIG. 14, contacts 1400 are formed over substrate 800. Contacts 1400 may be formed of aluminum copper (AlCu) and are used for eutectic bonding in subsequent process steps. In some embodiments, a different conductive material suitable for eutectic bonding such as Ge, Au, or the like, or a combination or alloy thereof, may be used instead.

Any suitable method of forming contacts 1400 may be used. In some embodiments, a seed layer (not shown) may be deposited over substrate 800. A photoresist layer may be subsequently deposited and patterned, where openings in the photoresist layer expose the desired positions of contacts 1400. The openings may be filled with a conductive material using, for example, an electroless plating process or an electrochemical plating process, thereby creating contacts 1400. The top-view shapes of contacts 1400 may be rectangles, squares, circles, or the like. Next, an etch step or a grinding step such as a CMP process may be performed to remove any excess conductive material overlying contacts 1400. Any suitable etching or grinding process may be used. The photoresist layer may be removed. Another photoresist mask may be deposited and patterned, where openings in the photoresist layer expose the portions of the seed layer that do not underlie a contact 1400. The exposed portions of the seed layer may be etched, and the photoresist layer may be removed, leaving the structure depicted in FIG. 14. Other methods of forming contacts 1400 are possible.

Figure 15:
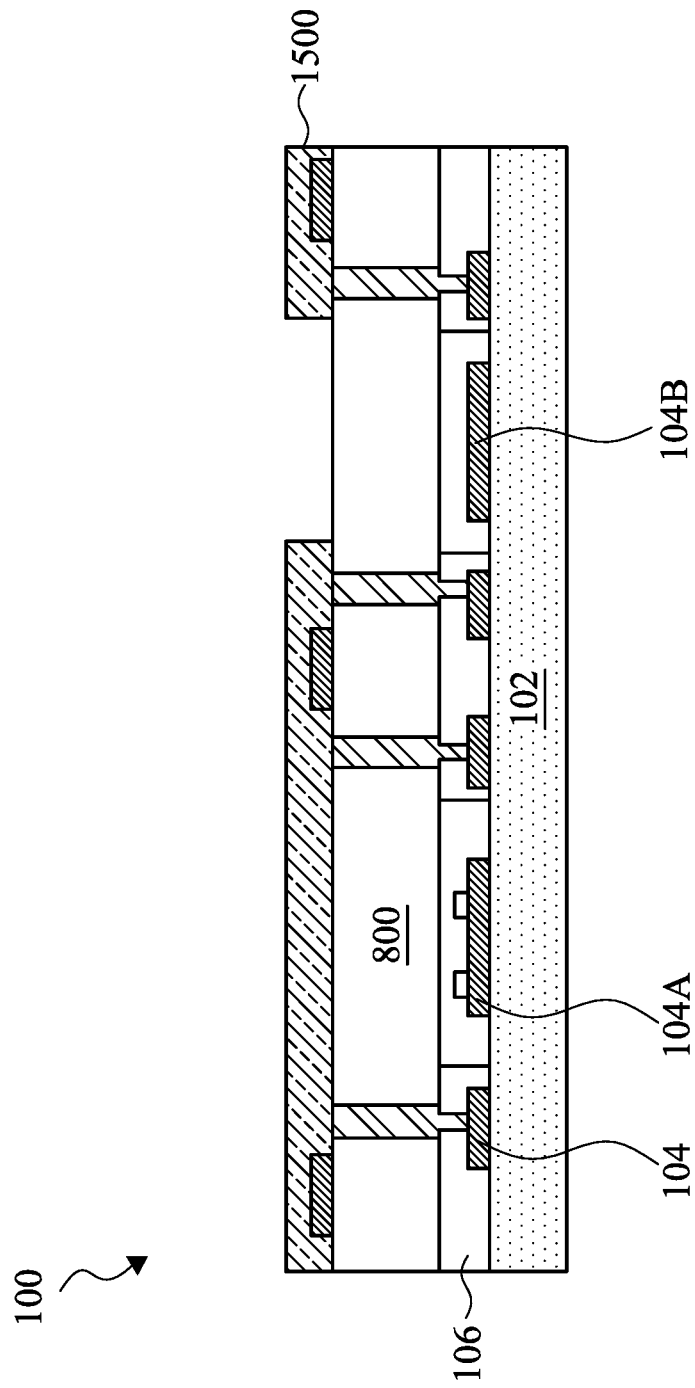
Figure 16:
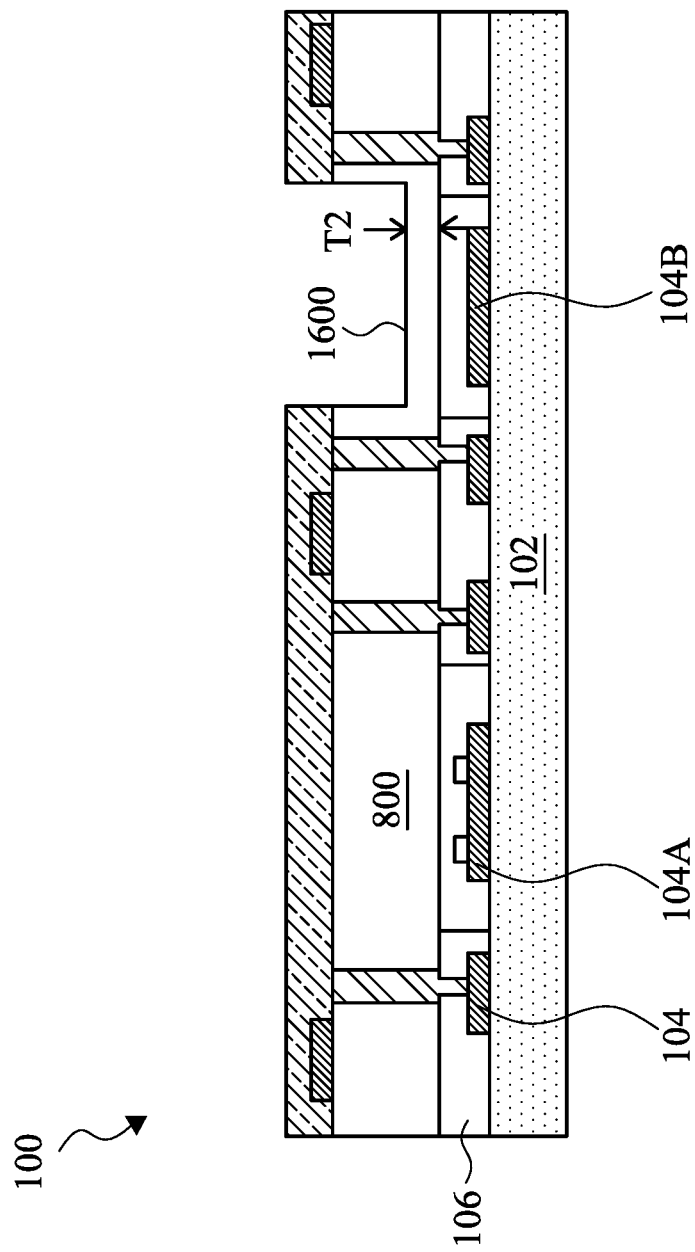

Next, photoresist layer 1500 is deposited over substrate 800 and contacts 1400 and patterned, as shown in FIG. 15. The opening in FIG. 15 exposes a section of substrate 800 over sensor 104B where a pressure sensor membrane will be formed. An etching is then performed on the area of substrate 800 exposed by photoresist layer 1500 using any acceptable etching method. The etched structure is depicted in FIG. 16. As can be seen from FIG. 16, the etching creates membrane 1600, which works in conjunction with sensor 104B as a MEMS pressure sensor. In some embodiments, membrane 1600 may have a thickness T2 between about 0.5 µm to about 10 µm, such as about 5 µm. After the etching, photoresist layer 1500 is removed. Photoresist layer 1500 may be removed through a process such as dissolving in chemical solution, plasma ashing or other means, whereby the temperature of photoresist layer 1500 is increased until photoresist layer 1500 decomposes and may be removed.

Figure 17:
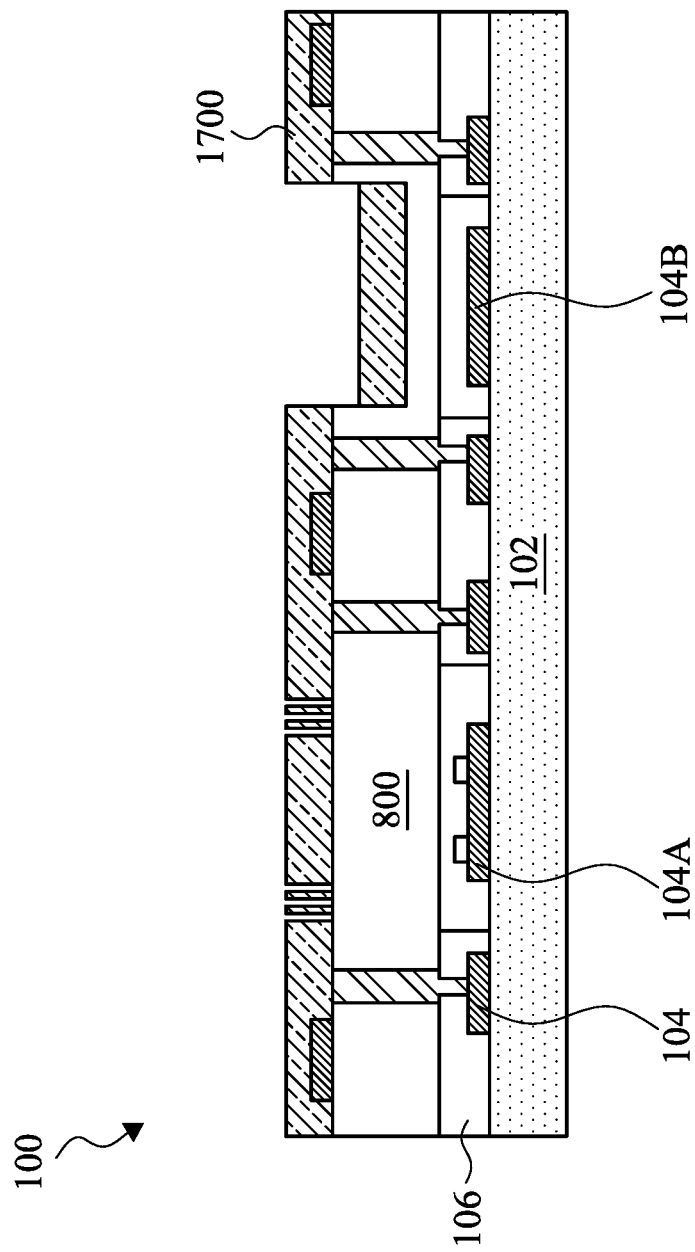
Figure 18:
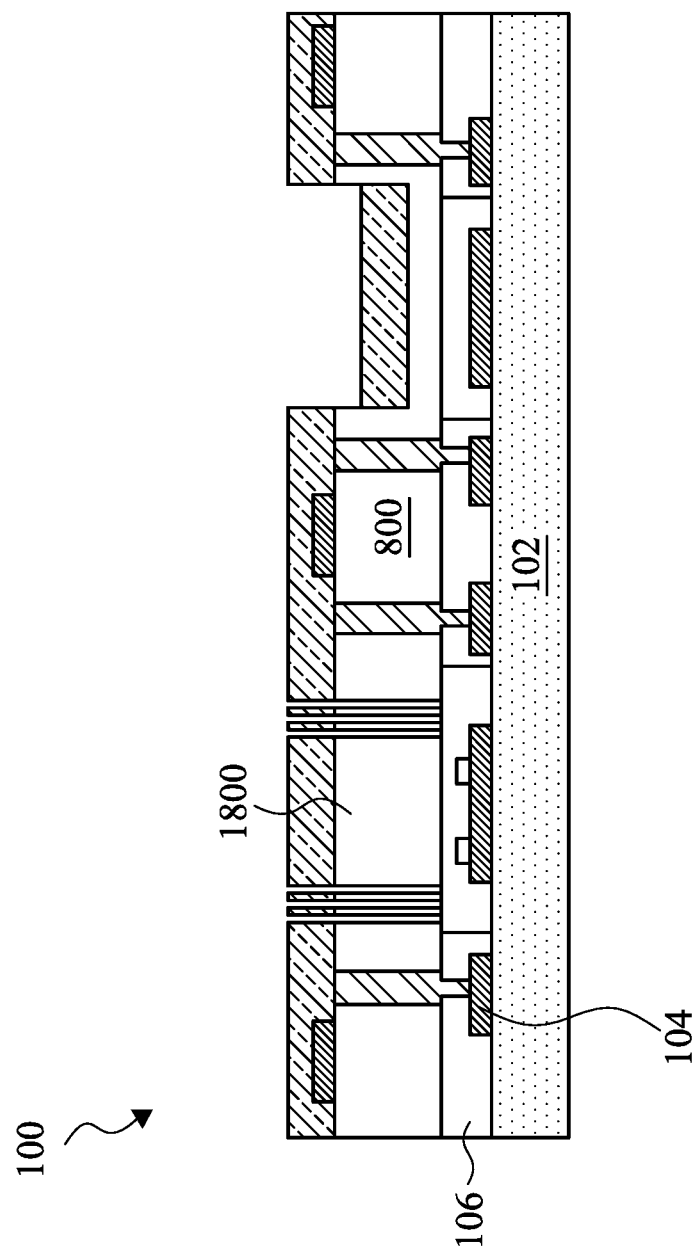

Next, referring to FIG. 17, photoresist layer 1700 is deposited over substrate 800 and patterned. After being patterned, openings in photoresist layer 1700 expose areas of substrate 800 over sensor 104A. Next, an etching is performed on substrate 800 through the openings in layer 1700. Any acceptable etching process may be used, such as wet or dry etching. The etched structure is shown in FIG. 18. The etching creates movable mass 1800. Movable mass 1800 may work in conjunction with sensor 104A to provide a MEMS accelerometer. Movable mass 1800 is attached to other areas substrate 800, for example using springs (not shown) disposed between movable mass 1800 and other areas of substrate 800. The springs attach movable mass 1800 to the overall structure while still allowing movable mass 1800 to move.

Figure 19:
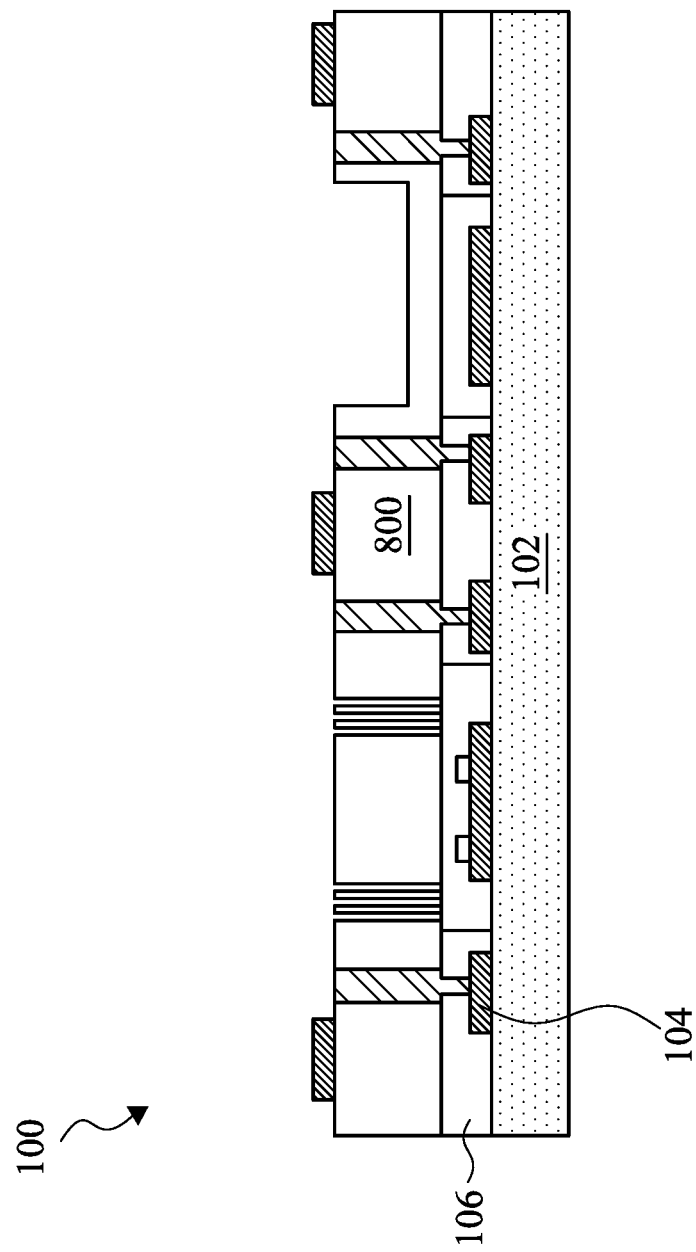
Figure 20:
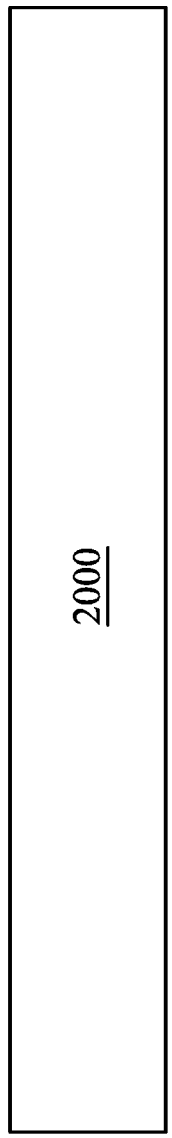

Next, photoresist layer 1700 is removed. Photoresist layer 1700 may be removed through a process such as dissolving in chemical solution, plasma ashing or other means, whereby the temperature of photoresist layer 1700 is increased until photoresist layer 1700 decomposes and may be removed. The resulting structure is depicted in FIG. 19.

Next, a cap wafer will be bonded to the structure 100. FIGS. 20 through 24 illustrate various intermediary steps of manufacture of a cap wafer 2000 for inclusion in the completed MEMS device 2500. Cap wafer 2000, depicted in FIG. 20, may or may not be a semiconductor wafer (e.g., a CMOS wafer), which may or may not have electrical circuits (not shown). In particular cap wafer 2000 may include various active devices such as transistors, capacitors, resistors, diodes, photodiodes, fuses and the like. The electrical circuits may be interconnected to perform one or more functions suitable for a particular application, which may or may not be related to MEMS device 2500.

Figure 21:
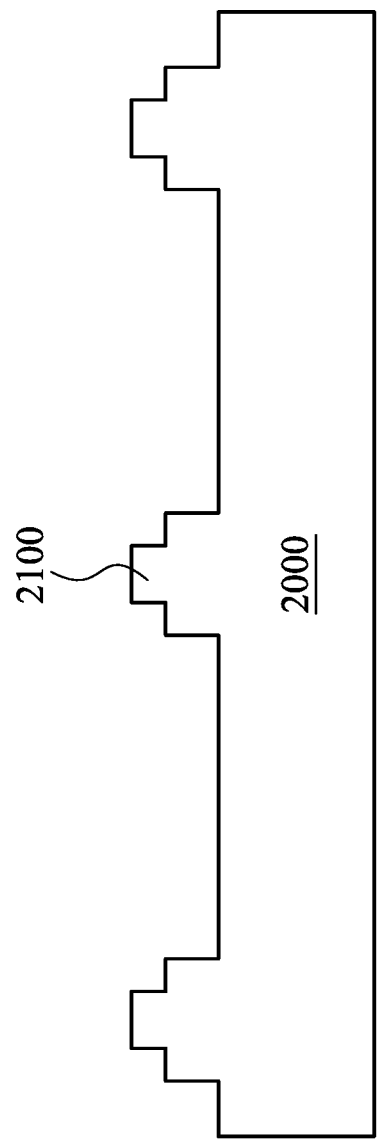

Referring to FIG. 21, cap wafer 2000 is patterned to create a plurality of bonding regions 2100. Bonding regions 2100 are regions where cap wafer 2000 will be bonded to structure 100. Bonding regions 2100 may be created in cap wafer 2000 using any suitable etching techniques, including those described above. For example, a photoresist layer may be deposited over cap wafer 2000 and patterned, where openings in the photoresist layer expose regions of cap wafer 2000 to be etched. An etching may be performed using any suitable etching process, such as wet or dry etching. The photoresist layer may be removed, for example through a process such as dissolving in chemical solution, plasma ashing or other means, whereby the temperature of the photoresist is increased until the photoresist decomposes and may be removed.

These steps may be repeated as necessary to achieve the desired shape of cap wafer 2000, as determined according to the particular package design.

Figure 22:
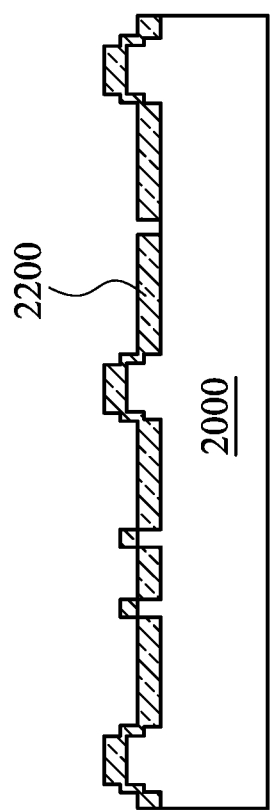

Next, referring to FIG. 22, a photoresist layer 2200 is deposited over cap wafer 2000. Photoresist layer 2200 is patterned to create an opening exposing a section of cap wafer 2000 in which a hole will be created. As will be explained below, after cap wafer 2000 is bonded to structure 100, a cavity will be created between cap wafer 2000 and pressure sensor membrane 1600. A subsequent thinning of cap wafer 2000 will expose the inner cavity to ambient pressure through the hole in cap wafer 2000 (see FIG. 26).

Figure 23:
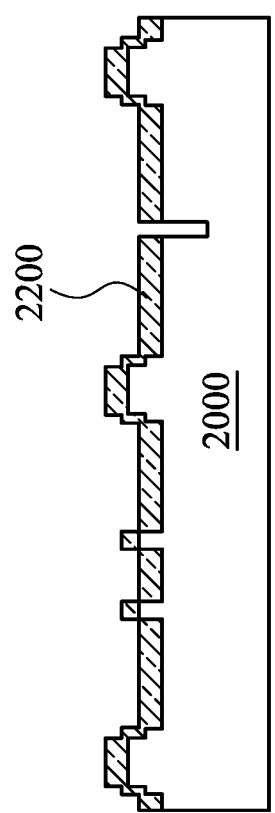

Referring to FIG. 23, a hole is etched in cap wafer 2000 through the opening in photoresist layer 2200. Any acceptable etching process may be used, such as a dry etching or a wet etching. The hole created by the etching does not penetrate through cap wafer 2000, and the hole terminates within cap wafer 2000.

After the hole is etched into cap wafer 2000, photoresist layer 2200 is removed. Photoresist layer 2200 may be removed through a process such as dissolving in chemical solution, plasma ashing or other means, whereby the temperature of photoresist layer 2200 is increased until photoresist layer 2200 decomposes and may be removed.

Figure 24:
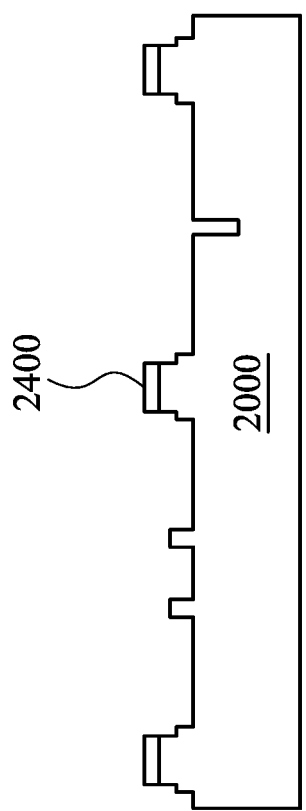

Next, referring to FIG. 24, bonding material layer 2400 (alternatively referred to as bonds 2400) are formed over a top surface of cap wafer 2000. Bonding material layers 2400 may be blanket deposited and patterned using for example PVD and photolithography/etching. Bonding material layers 2400 may be made of a layer of AlCu under a layer of germanium although other metallic materials such as gold may also be used. Bonding material layers 2400 may act as a eutectic bonding material for a subsequent bonding process. Bonding material layers 2400 may or may not be electrically connected to conductive lines within cap layer 2000.

FIG. 25 illustrates stacked MEMS device 2500, wherein cap wafer 2000 is flipped and stacked over structure 100. Cap wafer 2000 may be bonded to structure 100 by eutectic bonding between bonding material layers 2400 and contacts 1400. As shown in FIG. 25, through the eutectic bonding process, moveable elements (e.g., movable mass 1800) may be located between accelerometer sensor 104A and cap wafer 2000. Furthermore, cap wafer 2000 and structure 100 are aligned so that sensor 104A is disposed in a sealed cavity defined by the eutectic bonding.

In FIG. 26, a grinding process is performed to remove portions of cap wafer 2000. The grinding may also be referred to as an open pad grinding (OPG) exposing portions of cap wafer 2000 and may be done using known grinding techniques. The removal of portions of cap wafer 2000 may include known removal techniques such as CMP, etch-back, a combination thereof, or the like.

In some embodiments, the OPG of cap wafer 2000 may expose portions of metal lines (not shown) within cap wafer 2000. These exposed portions of metal lines may be used as input/output pads to electrically couple circuits in cap wafer 2000 to external circuits (not shown). Further, the grinding may expose cavity 2600 to ambient pressure. That is, cavity 2600 is exposed to an open air environment.

FIG. 26 illustrates a completed MEMS device 2500 in accordance with various embodiments. MEMS device 2500 includes a pressure sensor 2602. Pressure sensor 2602 includes a membrane (i.e., region 1600 of substrate 800) and a sensor 104B. Membrane 1600 is exposed to ambient pressure on one surface (e.g., through cavity 2600) and sealed pressure on the other surface (e.g., through sealed cavity 2606). Cavity 2600 is partially bounded by membrane 1600. The pressure of sealed cavity 2606 may be defined by the conditions of the fusion bonding process between dielectric layer 106 and substrate 800. For example, the fusion bonding process may be performed in chamber having a certain pressure level to define an appropriate pressure level of the sealed cavities. For example, sealed cavity 2606 may have a pressure from about 1 mbar to about 300 mbar, such as 10 mbar. Therefore, pressure sensor 2602 may detect ambient pressure by comparing the difference between cavity 2600 and sealed cavity 2606.

MEMS device 2500 also contains an accelerometer that detects acceleration through the disposition of movable mass 1800 over accelerometer sensor 104A in sealed cavity 2608 having pressure defined by eutectic bonding. For example, movable mass 1800 may move in relation to the overall motion of the accelerometer, thereby causing the capacitance of the sensor 104A to change and allowing a processor (not shown in FIG. 26) to determine the acceleration from the movement of the movable mass 1800. The pressure of sealed cavity 2608 may be selected in accordance with the desired functionality of accelerometer 2604. The pressure of sealed cavity 2608 may be defined by the conditions of the bonding process between bonding material layers 2400 and contacts 1400. For example, the eutectic bonding process may be performed in chamber having a certain pressure level to define an appropriate pressure level of the sealed cavities. For example, sealed cavity 2608 may have a pressure from about 1 mbar to about 1100 mbar, such as 700 mbar.

Thus, using the various formation steps illustrated in FIGS. 1 through 26, a pressure sensor and an accelerometer may be formed on a single chip and using the same MEMS manufacturing process with minimal additional cost. The processes and devices described herein may provide for integrated MEMS devices with smaller sizes. The processes and devices described herein may also provide for integrated MEMS devices produced with reduced cost.

According to certain embodiments, a method for forming a micro-electromechanical (MEMS) device is provided. The method includes patterning a dielectric layer of a first substrate to expose conductive features and a bottom layer through the dielectric layer. The first substrate includes the dielectric layer and the bottom layer. The conductive features are disposed in the dielectric layer proximate to the bottom layer. A first surface of a second substrate is bonded to the dielectric layer. The second substrate is patterned to form a membrane and a movable element. A first plurality of metal bonds is formed on a second surface of the second substrate, where the second surface is opposite the first surface. A second plurality of metal bonds is formed on a surface of a cap wafer. A cap wafer is bonded to the second substrate by bonding the second plurality of metal bonds to the first plurality of metal bonds. Bonding the cap wafer to the second substrate forms a first sealed cavity comprising the movable element and a second sealed cavity that is partially bounded by the membrane. Portions of the cap wafer are removed to expose the second sealed cavity to ambient pressure.

According to certain embodiments, a method for forming a micro-electromechanical (MEMS) device is provided. The method includes patterning a dielectric layer of a first substrate to create a first cavity and a second cavity. The first substrate includes the dielectric layer and a bottom layer. A first electrode is disposed on the bottom layer in the first cavity and a second electrode disposed on the bottom layer in the second cavity. The dielectric layer is patterned to expose a plurality of conductors, the conductors disposed in the dielectric layer on the bottom layer. A first surface of a second substrate is bonded to the dielectric layer, the bonding sealing the second cavity. A plurality of through vias are formed that extend from the conductors through the second substrate. The second substrate is patterned to create a movable feature, the movable feature positioned over the first electrode. The second substrate is patterned to create a membrane, the membrane positioned over the second electrode. An opening is formed in a third substrate. The third substrate is bonded to the second substrate in a manner that the opening in the third substrate is positioned over the membrane, where bonding the third substrate to the second substrate forms a third sealed cavity and a fourth sealed cavity. The third sealed cavity comprises the movable feature and the first cavity. The fourth cavity is partially bounded by the membrane. Portions of the third substrate are removed to expose the fourth sealed cavity to ambient pressure through the opening in the third substrate.

According to certain embodiments, a micro-electromechanical (MEMS) device is provided. The device includes a first substrate. The first substrate includes a bottom layer, a dielectric layer overlying the bottom layer, and an upper layer overlying the dielectric layer. A first cavity is disposed in the dielectric layer. The first cavity is partially bounded by the bottom layer and partially bounded by a membrane formed from the upper layer. A first conductive feature is disposed in the first cavity and the first cavity has a first pressure. A second conductive feature is disposed in a second cavity. A movable element is positioned over the second conductive feature. The second cavity has a second pressure. A cap wafer is bonded to the first substrate. The cap wafer and the first substrate define a third cavity having an ambient pressure. The third cavity is partially bounded by the membrane. The second cavity extends through the upper layer of the first substrate to the cavity wafer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A micro-electromechanical (MEMS) device, comprising:
    a first substrate comprising:
        a bottom layer;
        a dielectric layer overlying the bottom layer;
        an upper layer overlying the dielectric layer, the upper layer comprising a membrane and a movable element, wherein the membrane has a planar upper surface and the movable element has a planar upper surface and further wherein the planar upper surface of the membrane is closer to the bottom layer than is the planar upper surface of the movable element;
        a first cavity disposed in the dielectric layer, the first cavity partially bounded by the bottom layer, partially bounded by the dielectric layer, and partially bounded by the membrane, wherein a first conductive feature is disposed in the first cavity on the bottom layer, and the first cavity has a first pressure; and
        a second conductive feature disposed on the bottom layer in an opening of the dielectric layer, wherein the movable element is positioned over the second conductive feature; and
    a plurality of bonds disposed on a surface of the upper layer, wherein the membrane is directly physically connected to a first portion of the upper layer on which a first bond of the plurality of bonds is disposed and to a second portion of the upper layer on which a second bond of the plurality of bonds is disposed, wherein the first bond and the second bond are closest bonds to the membrane; and
    a cap layer bonded to the first substrate using the plurality of bonds, wherein the cap layer and the first substrate define a second cavity having a second pressure and a third cavity having an ambient pressure, the third cavity being partially bounded by the membrane, and wherein the second cavity extends through the upper layer of the first substrate to the bottom layer, the movable element is disposed in the second cavity, and the second pressure is different than the first pressure.

2. The MEMS device of claim 1, further comprising a plurality of anti-stiction bumps over the second conductive feature.

3. The MEMS device of claim 1, wherein the cap layer is a semiconductor wafer comprising active circuits.

4. The MEMS device of claim 1, wherein the cap layer comprises an opening that exposes the third cavity to the ambient pressure.

5. The MEMS device of claim 1, wherein the cap layer comprises a plurality of anti-stiction bumps over the movable element.

6. The MEMS device of claim 1, wherein a sidewall of the second conductive feature is exposed in the second cavity.

7. The MEMS device of claim 1, further comprising:
    a first through via extending through the upper layer on a first side of the movable element;
    a second through via extending through the upper layer on a second side of the movable element, the first side of the movable element being opposite to the second side of the movable element;
    a third through via extending through the upper layer on a first side of the membrane, the third through via being adjacent to the second through via; and
    a fourth through via extending through the upper layer on a second side of the membrane, the second side of the membrane being opposite to the first side of the membrane.

8. The MEMS device of claim 7, wherein the second bond of the plurality of bonds is laterally disposed between the second through via and the third through via.

9. The MEMS device of claim 8, wherein the second through via and the third through via are directly physically coupled to the second portion of the upper layer on which the second bond is disposed.

10. A micro-electromechanical (MEMS) device, comprising:
    a first substrate, the first substrate comprising a dielectric layer disposed over a bottom layer, wherein a plurality of conductive pads is disposed in the dielectric layer, a first conductive pad of the plurality of conductive pads is a closest conductive pad to a first sensor, and a second conductive pad of the plurality of conductive pads is a closest conductive pad to a second sensor, and the dielectric layer is continuous between the first conductive pad the second conductive pad;

a second substrate disposed on the first substrate, wherein the second substrate comprises a membrane and a movable element, wherein a first cavity is defined by the first substrate and the membrane, the first cavity having a first pressure, and wherein the movable element is positioned over an opening of the first substrate, and wherein the first sensor is disposed in the first cavity under the membrane and the movable element is disposed over the second sensor, and further wherein the second substrate has a topmost surface on a first plane and the membrane has a planar top surface on a second plane that is closer to the first substrate than is the first plane; and a third substrate bonded to the second substrate by a plurality of metal bonds, wherein the plurality of metal bonds are disposed on a first surface of the second substrate, and the first surface of the second substrate is farther from the first substrate than a surface of the membrane that is farthest from the first substrate, and wherein the first substrate, the second substrate, and the third substrate define a second cavity having a second pressure, the second pressure being different than the first pressure.

11. The MEMS device of claim 10, wherein the movable element is disposed in the second cavity.

12. The MEMS device of claim 10, wherein the surface of the membrane that is farthest from the first substrate is exposed to ambient pressure by an opening in the third substrate.

13. The MEMS device of claim 10, further comprising at least four through vias extending through the second substrate.

14. The MEMS device of claim 13, wherein each of the at least four through vias are directly physically coupled to at least one portion of the second substrate on which a metal bond of the plurality of metal bonds is disposed.

15. A micro-electromechanical (MEMS) device, comprising:
a first substrate, comprising:
a bottom layer;
a middle layer over the bottom layer, the middle layer comprising a first opening and a second opening;
an upper layer over the middle layer, wherein the upper layer comprises a movable element and a membrane, the movable element is disposed over the first opening of the middle layer, and the membrane is disposed over the second opening of the middle layer, and a first cavity having a first pressure is defined by the membrane, the bottom layer, and the middle layer, and further wherein the membrane has a planar upper surface and the movable element has a planar upper surface and further wherein the planar upper surface of the membrane is closer to the bottom layer than is the planar upper surface of the movable element;
a first through via extending through the upper layer on a first side of the first opening;
a second through via extending through the upper layer on a second side of the first opening, the first side of the first opening being opposite to the second side of the first opening;
a third through via extending through the upper layer on a first side of the second opening; and
a fourth through via extending through the upper layer on a second side of the second opening, the first side of the second opening being opposite to the second side of the second opening; and
a cap layer, wherein the cap layer is physically coupled to the first substrate by a plurality of bonds, and the upper layer is continuous between the second through via and the third through via, and wherein a second cavity is defined by the cap layer and the first substrate, the movable element is disposed in the second cavity, and the second cavity has a second pressure that is different than the first pressure.

16. The MEMS device of claim 15, wherein the second cavity is partially defined by the first opening of the middle layer.

17. The MEMS device of claim 15, wherein the third through via is adjacent to the second through via.

18. The MEMS device of claim 15, wherein a second bond of the plurality of bonds overlies a portion of the upper layer that is directly physically connected to the first through via.

19. The MEMS device of claim 15, wherein a second bond of the plurality of bonds overlies a portion of the upper layer that is directly physically connected to the fourth through via.

20. The MEMS device of claim 15, wherein the plurality of bonds is disposed on a first surface of the upper layer, and the first surface of the upper layer is farther from the bottom layer than a surface of the membrane that is farthest from the bottom layer.

* * * * *